United States Patent
Shen et al.

(10) Patent No.: US 11,609,254 B2
(45) Date of Patent: Mar. 21, 2023

(54) ELECTROMAGNETIC SHIELDED TESTING CHAMBER WITH VENTILATION

(71) Applicant: Apple Inc., Cupertino, CA (US)

(72) Inventors: Jr-Yi Shen, Saratoga, CA (US); Sammer Al-Robaee, Calgary (CA); Ruska Patton, Calgary (CA); Jia-Woei Chen, Campbell, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/400,054

(22) Filed: Aug. 11, 2021

(65) Prior Publication Data
US 2023/0050818 A1 Feb. 16, 2023

(51) Int. Cl.
*G01R 31/00* (2006.01)
*G01R 29/08* (2006.01)
*H05K 9/00* (2006.01)

(52) U.S. Cl.
CPC ....... *G01R 29/0821* (2013.01); *G01R 31/001* (2013.01); *H05K 9/0069* (2013.01)

(58) Field of Classification Search
CPC ............ G01R 29/0821; G01R 29/0871; G01R 29/0878; G01R 29/10; G01R 29/105; G01R 31/001; G01R 31/302; G01R 31/2851; G01R 31/2834; H05K 9/0015; H05K 9/0041; H05K 9/69; H01R 24/54; H01R 24/56

See application file for complete search history.

(56) References Cited

U.S. PATENT DOCUMENTS

| | | |
|---|---|---|
| 6,163,454 A | 12/2000 | Strickler |
| 9,095,045 B2 | 7/2015 | Rojo et al. |
| 9,124,956 B2 | 9/2015 | Heimann et al. |
| 9,203,369 B2 | 12/2015 | Cook et al. |
| 9,576,567 B2 | 2/2017 | Moser |
| 10,598,711 B2 | 3/2020 | Sim et al. |
| 2005/0265003 A1 | 12/2005 | Coglitore et al. |
| 2011/0227775 A1* | 9/2011 | Hirose ................... H01Q 17/00 342/1 |
| 2015/0369853 A1* | 12/2015 | Chen .................. G01R 31/1254 324/415 |
| 2017/0237146 A1 | 8/2017 | Dureja |
| 2019/0101580 A1* | 4/2019 | Huang ..................... H04B 1/16 |

(Continued)

FOREIGN PATENT DOCUMENTS

| | | |
|---|---|---|
| CN | 212629086 | 2/2021 |
| EP | 2639630 | 9/2013 |

*Primary Examiner* — Thang X Le
(74) *Attorney, Agent, or Firm* — Fletcher Yoder PC

(57) ABSTRACT

A testing apparatus for electromagnetically sensitive equipment includes a housing defining a testing chamber. The housing blocks transmission of electromagnetic waves from an external environment into the testing chamber and reduces reflection of electromagnetic waves within the testing chamber. The testing apparatus also includes a tube defining an air flow path between the testing chamber and the external environment. The tube blocks transmission of electromagnetic waves from the external environment into the air flow path. The tube includes a proximal end coupled to an opening in the housing such that the air flow path is fluidly coupled to the testing chamber via the opening, a distal end opposing the proximal end, and a bent segment extending between the proximal end and the distal end.

20 Claims, 5 Drawing Sheets

(56) References Cited

U.S. PATENT DOCUMENTS

2020/0011814 A1* 1/2020 Rasmussen ............ G01N 22/00
2021/0055337 A1* 2/2021 Kobayashi ......... G01R 29/0864
2021/0293869 A1* 9/2021 Kobayashi ......... G01R 31/2874

* cited by examiner

ELECTROMAGNETIC SHIELDED TESTING CHAMBER WITH VENTILATION

BACKGROUND

The present disclosure generally relates to a testing apparatus for electromagnetically sensitive equipment, and more specifically to an air flow assembly of the testing apparatus.

Electronic devices, such as laptops, mobile phones, televisions, smart watches, AM/FM radios, and the like, include various components, such as transceivers, transmitters, receivers, and antennas, to wirelessly transmit and/or receive communications via electromagnetic waves, such as radio waves. These components, referred to in certain instances of the present disclosure as electromagnetically sensitive equipment, may be tuned or otherwise configured to convert between electrical data signals and electromagnetic waves. In order to ensure adequate performance of the electromagnetically sensitive equipment, a testing apparatus defining a testing chamber may be employed to test various performance metrics of the electromagnetically sensitive equipment. However, conventional testing apparatuses may include or be employed in relatively uncontrolled environments. For example, conventional testing apparatuses may include poor temperature control of the testing chamber in which the electromagnetically sensitive equipment is disposed for testing. Further, conventional testing apparatuses may include poor shielding of the testing chamber from transmission of electromagnetic waves into the testing chamber from an external environment, and poor electromagnetic anti-reflective properties that enable undesirable reflection of electromagnetic waves from internal surfaces of the testing apparatus toward the electromagnetically sensitive equipment. The relatively uncontrolled environment of conventional testing apparatuses may lead to inaccurate test results, imprecise tuning of the electromagnetically sensitive equipment, and inadequate performance of the electromagnetically sensitive equipment and corresponding electronic devices. Accordingly, it is now recognized that an improved testing apparatus for testing electromagnetically sensitive equipment is desired.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a testing apparatus for electromagnetically sensitive equipment includes a housing defining a testing chamber. The housing is configured to block transmission of electromagnetic waves from an external environment into the testing chamber and to reduce reflection of electromagnetic waves within the testing chamber. The testing apparatus also includes a tube defining an air flow path between the testing chamber and the external environment. The tube is configured to block transmission of electromagnetic waves from the external environment into the air flow path. The tube includes a proximal end coupled to an opening in the housing such that the air flow path is fluidly coupled to the testing chamber via the opening, a distal end opposing the proximal end, and a bent segment extending between the proximal end and the distal end.

In another embodiment, a testing apparatus for electromagnetically sensitive equipment includes a housing defining a testing chamber configured to receive the electromagnetically sensitive equipment. The testing apparatus also includes an air flow assembly having a proximal end coupled to the housing and a tube extending between the proximal end and a distal end of the air flow assembly. The tube defines an air flow channel between the testing chamber and an environment external to the testing apparatus. The tube includes a bent segment extending between the proximal end of the air flow assembly and the distal end of the air flow assembly. The testing apparatus also includes an electromagnetic barrier defined about the testing chamber by a first conductive material of the housing and a second conductive material of the air flow assembly.

In yet another embodiment, an air flow assembly for an electromagnetic wave testing apparatus includes a first end configured to be coupled to a housing of the electromagnetic wave testing apparatus and including a first conductive material, a second end opposing the first end and including a second conductive material, and an air flow tube extending from the first end to the second end and including a third conductive material. The air flow tube defines a 45-135 degree bend between the first end and the second end.

Various refinements of the features noted above may be made in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
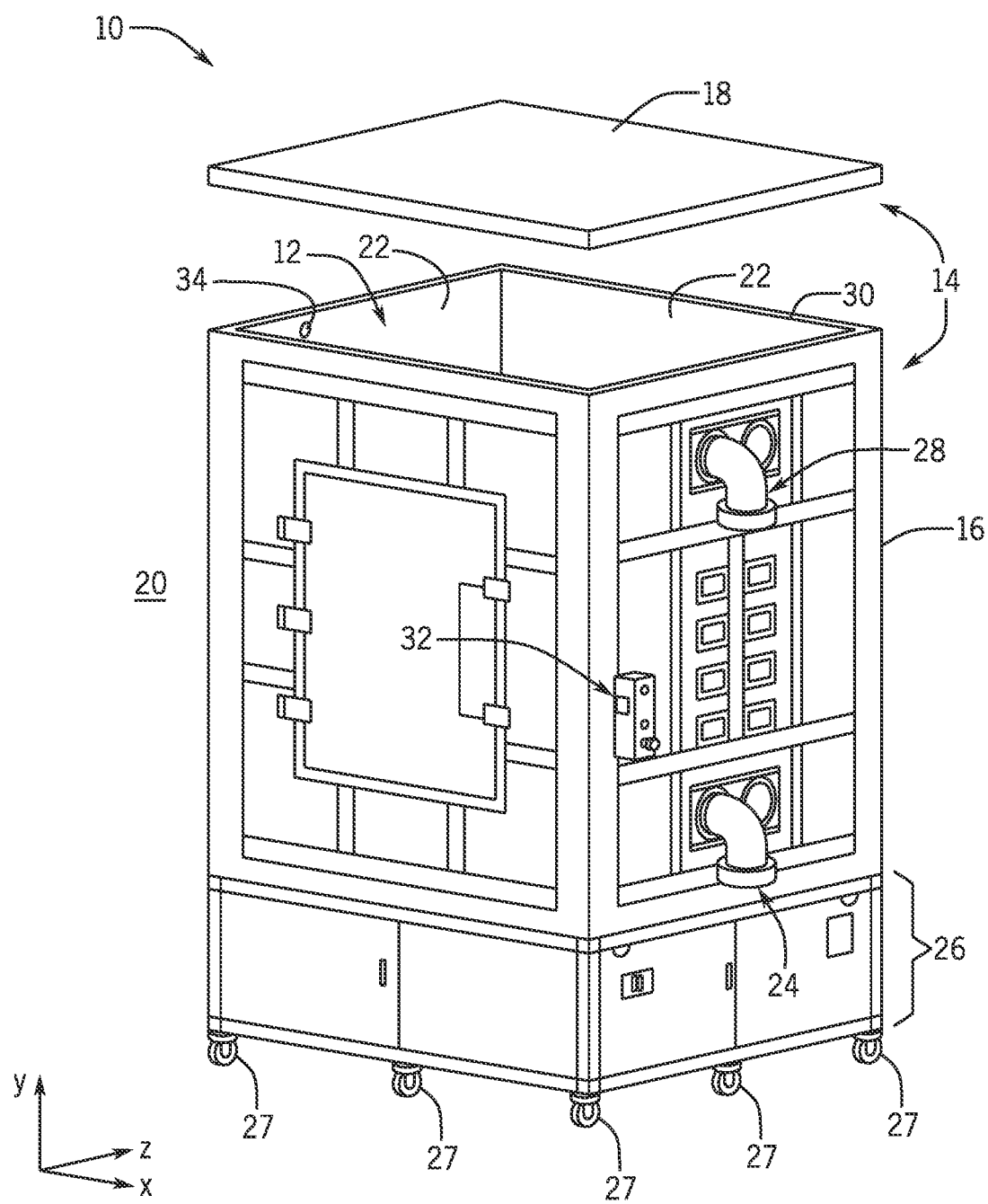
FIG. 1 is a perspective view of a testing apparatus for testing electromagnetically sensitive equipment, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the term "approximately," "near," "about", "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

The disclosure is directed to a testing apparatus for electromagnetically sensitive equipment, and more specifically to air flow assemblies of the testing apparatus. For example, electromagnetically sensitive equipment that facilitates wireless communication via electromagnetic waves (e.g., radio waves) may be employed in a variety of electronic devices, such as a laptop, a mobile phone, a television, a smart watch, an AM/FM radio, or the like. The electromagnetically sensitive equipment employed in these electronic devices may include transceivers, transmitters, receivers, and/or antennas. In order to ensure adequate performance of the electromagnetically sensitive equipment, a testing apparatus defining a testing chamber may be employed to test or measure various performance metrics of the electromagnetically sensitive equipment disposed within the testing chamber. Based at least in part on the test results, the electromagnetically sensitive equipment may be tuned or otherwise configured for desired performance in the electronic devices employing the electromagnetically sensitive equipment.

In accordance with the present disclosure, the testing apparatus may include a housing defining the testing chamber that receives the electromagnetically sensitive equipment (e.g., a transceiver, a transmitter, a receiver, and/or an antenna) and/or devices having the electromagnetically sensitive equipment. In general, aspects of the testing apparatus, including the housing and air flow assemblies used to control a temperature of the testing chamber, may define an electromagnetic barrier (e.g., a Faraday cage) about the testing chamber. For example, the housing and the air flow assemblies may include a material, such as a conductive material, that surrounds the testing chamber and generates the electromagnetic barrier (e.g., the Faraday cage) about the testing chamber. It should be noted that the conductive material may be employed as a mesh or a screen in certain portions of the testing apparatus, such as in waveguides associated with the air flow assemblies of the testing apparatus, while still maintaining the electromagnetic barrier about the testing chamber. In general, the electromagnetic barrier may block electromagnetic waves in an environment surrounding the testing apparatus (e.g., external to the testing apparatus) from being transmitted through the testing apparatus and into the testing chamber.

The testing chamber, isolated from electromagnetic waves outside of the testing apparatus as described above, may also be protected from electromagnetic interference associated with reflection of electromagnetic waves propagated by the electromagnetically sensitive equipment within the testing chamber. For example, aspects of the testing apparatus, including the housing and the air flow assemblies, may include electromagnetic anti-reflective properties that reduce or negate reflection of electromagnetic waves (or effects thereof) from internal surfaces of the testing apparatus and directed back toward the electromagnetically sensitive equipment within the testing chamber. That is, certain inner surfaces of the testing apparatus, including the inner surfaces of the housing and/or the inner surfaces of the air flow assemblies, may be defined by (or include) electromagnetic absorbing material, such as a dielectric polyurethane material, that may attenuate or reduce an intensity of electromagnetic waves that contact the electromagnetic absorbing material.

The above-described air flow assemblies may be coupled to the housing of the testing apparatus about corresponding openings in the housing, such that air flow channels of the air flow assemblies are fluidly coupled to the testing chamber defined by the housing. In general, the air flow assemblies may be employed to control a temperature of the testing chamber. One of the air flow assemblies may enable an air flow from the environment surrounding the testing apparatus into the testing chamber. The other of the air flow assemblies may enable an air flow from the testing chamber to the environment surrounding the testing apparatus.

One or both of the air flow assemblies may include a fan that generates the above-described air flows. A thermostat associated with the testing apparatus may receive sensor feedback indicative of a temperature of the testing chamber and control the one or more fans based on the sensor feedback. For example, in certain operating conditions, the sensor feedback may indicate that the temperature of the testing chamber is higher than a threshold temperature. The thermostat may activate the one or more fans of the air flow assemblies in response to the temperature of the testing chamber being higher than the threshold temperature. The air flows into and out of the testing chamber, enabled by the air flow assemblies and corresponding fan(s) activated by the thermostat, and may reduce the temperature of the testing chamber. The thermostat may deactivate the fan(s) in response to the temperature of the testing chamber being reduced below the threshold temperature.

While the air flow assemblies may include inner surfaces defined by electromagnetic absorbing material that may attenuate electromagnetic waves, the air flow assemblies may additionally or alternatively include a geometry that reduces or negates electromagnetic interference otherwise caused by electromagnetic waves reflected from the inner surfaces of the testing apparatus. For example, each air flow assembly may include a proximal end coupled to the housing about a corresponding opening in the housing, a distal end opposing the proximal end, and a tube extending from the proximal end to the distal end. An inner surface extending from the proximal end, through the tube, and to the distal end of the air flow assembly may define an air flow path between the testing chamber and the environment surrounding the testing apparatus. The tube may include a bend, referred to in certain instances of the present disclosure as a bent segment. The bent segment may cause electromagnetic waves contacting a first portion of the inner surface of the air flow assembly at the bent segment to reflect in a preferred direction or at a preferred angle toward a second portion of the inner surface of the air flow assembly.

Multiple contacts between the electromagnetic wave and the inner surface of the air flow assembly may improve attenuation of the electromagnetic wave, thereby decreasing or negating undesirable effects of electromagnetic waves reflected back toward the electromagnetically sensitive equipment disposed in the testing chamber. As previously described, each air flow assembly may include a waveguide forming a mesh or screen via a material, such as a conductive material, that enables an air flow therethrough while maintaining the electromagnetic barrier about the testing chamber. The waveguide may be disposed, for example, in the distal end of the air flow assembly. In some embodiments, the fan(s) of the air flow assemblies are disposed adjacent to, or extend into, the waveguides of the air flow assemblies.

The above-described testing apparatus, described in more detail below with reference to the drawings, facilitates a more controlled environment of the corresponding testing chamber relative to conventional systems. For example, the presently disclosed testing apparatus may reduce or negate transmission of electromagnetic waves through the testing apparatus and into the testing chamber, reduce or negate undesirable reflection of electromagnetic waves within the testing chamber, and/or improve temperature control of the testing chamber over conventional systems. These and other features are described in detail below with reference to the drawings.

FIG. 1 is a perspective view of an embodiment of a testing apparatus 10 for testing electromagnetically sensitive equipment. The testing apparatus 10 may include a testing chamber 12 that receives the electromagnetically sensitive equipment. The electromagnetically sensitive equipment may include, for example, a transceiver, a transmitter, a receiver, and/or an antenna, or any device having these components, utilized to wirelessly transmit and/or receive communications via electromagnetic waves, such as radio waves. For example, the electromagnetically sensitive equipment may be used in a variety of electronic communication devices, such as laptops, mobile phones, televisions, AM/FM radios, smart watches, and the like.

Tests conducted via the testing apparatus 10 may be performed to tune or otherwise configure the electromagnetically sensitive equipment for, for example, appropriately converting between electrical data signals and electromagnetic signals, such as radio frequency signals. In order to test the electromagnetically sensitive equipment in a controlled environment, the testing apparatus 10 may include various features described in detail below that control a temperature of the testing chamber 12 and/or isolate the testing chamber 12 and the electromagnetically sensitive equipment within the testing chamber 12 from various types of electromagnetic interference. The controlled environment associated with embodiments of the present disclosure may improve accuracy and precision of the tests conducted on the electromagnetically sensitive equipment.

In the illustrated embodiment, the testing apparatus 10 includes a housing 14 defining the testing chamber 12 in which the electromagnetically sensitive equipment is disposed for testing. The housing 14 may include, for example, a body 16 and a lid 18 that may be coupled to the body 16 to generally enclose the testing chamber 12. The housing 14, along with other components of the testing apparatus 10, may block transmission of electromagnetic waves from an external environment 20 into the testing chamber 12. In particular, the housing 14 may include a material, such as a conductive material, that forms a portion of an electromagnetic barrier (e.g., Faraday cage) about the testing chamber 12. Other portions of the testing apparatus 10 that form other portions of the electromagnetic barrier will be described in detail below.

In addition to forming a portion of the above-described electromagnetic barrier, the housing 14 may include electromagnetic anti-reflective properties. For example, inner surfaces 22 of the housing 14 may be defined by (or include) an electromagnetic absorbing material that attenuates or reduces an intensity of electromagnetic waves emitted by the electromagnetically sensitive equipment and contacting the electromagnetic absorbing material. The electromagnetic absorbing material may include, for example, a dielectric material, such as a dielectric polyurethane material. An example of a dielectric polyurethane material that may define the inner surfaces 22 of the housing 14 is Eccosorb® AN-79. In some embodiments, the electromagnetic absorbing material may include a foam consistency (e.g., a dielectric polyurethane foam material). In general, the electromagnetic absorbing material may attenuate or reduce an intensity of an electromagnetic wave that contacts the electromagnetic absorbing material by 20-50 decibels.

The testing apparatus 10 in the illustrated embodiment also includes features that promote air flows through the testing chamber 12. Indeed, the electromagnetically sensitive equipment tested via the testing apparatus 10 may be temperature-sensitive. Thus, air flow features of the testing apparatus 10 may be employed to reduce undesirably high temperatures within the testing chamber 12. In the illustrated embodiment, the testing apparatus 10 includes a first air flow assembly 24 disposed adjacent to a base 26 of the testing apparatus 10, where the base 26 is coupled to (or defines a portion of) the body 16 of the housing 14 of the testing apparatus 10. In some embodiments, wheels 27 of the testing apparatus 10 may be coupled to the base 26 to enable rolling mobility of the testing apparatus 10.

Further, the testing apparatus 10 may include a second air flow assembly 28 disposed adjacent to a top 30 of the body 16 of the housing 14, where the top 30 may include a highest point or edge of the body 16 of the housing 14 relative to a height direction (e.g., y-axis). The lid 18 of the housing 14 may be coupled to the top 30 of the body 16 of the housing 14 when the testing apparatus 10 is in an operational state. The first air flow assembly 24 may facilitate an air flow from the external environment 20 into the testing chamber 12, whereas the second air flow assembly 28 may facilitate an air flow from the testing chamber 12 to the external environment 20. Locations of the first air flow assembly 24 and the second air flow assembly 28 relative to the housing 14 may differ in other embodiments.

In general, the first air flow assembly 24, the second air flow assembly 28, or both may include a fan that biases air flows from the external environment 20, through the first air flow assembly 24, into and through the testing chamber 12, through the second air flow assembly 28, and to the external environment 20. The fan(s) may be controlled via a thermostat 32 that receives, from a sensor 34 (e.g., a temperature sensor, such as a thermocouple), sensor feedback indicative of a temperature within the testing chamber 12. For example, the thermostat 32 may determine whether the sensor feedback indicates that the temperature within the testing chamber 12 is above a threshold temperature. In response to the temperature within the testing chamber 12 being above the threshold temperature, the thermostat 32 may activate the fan(s) associated with the first air flow assembly 24 and/or the second air flow assembly 28 to bias air flows into and out of the testing chamber 12, as described above. As noted above, the second air flow assembly 28 may output an air flow into the external environment 20 and the first air flow assembly 24 may receive an air flow from the external environment 20. Accordingly, cool air from the external environment 20 may be biased into a lower portion of the testing chamber 12 and warm air in the testing chamber 12 may be biased out of an upper portion of the testing chamber 12. The relative positions of the first air flow assembly 24 and the second air flow assembly 28 illustrated in FIG. 1 and described above may improve a cooling efficiency of the testing apparatus 10.

Like the housing 14 of the testing apparatus 10, the first air flow assembly 24 and the second air flow assembly 28 may include a material, such as a conductive material, that forms a portion of the electromagnetic barrier defined by the testing apparatus 10 about the testing chamber 12. Thus, electromagnetic waves propagating in the external environment 20 may be blocked from passing into the testing chamber 12 through the housing 14, the first air flow assembly 24, and the second air flow assembly 28. It should be noted that the conductive material of the housing 14, the first air flow assembly 24, and the second air flow assembly 28 may be different types of conductive materials, or the conductive material of the housing 14, the first air flow assembly 24, and the second air flow assembly 28 may be the same. Further, each of the housing 14, the first air flow assembly 24, and the second air flow assembly 28 may include multiple types of conductive materials (e.g., the housing 14 may include a first conductive material and a second conductive material different than the first conductive material). The conductive material or materials may include, for example, aluminum, copper, stainless steel, or some other conductive material. As will be appreciated in view of later drawings, each of the first air flow assembly 24 and the second air flow assembly 28 may include a waveguide that blocks transmission of electromagnetic waves into the air flow assemblies 24, 28 while enabling air to pass through the waveguides and between the testing chamber 12 and the external environment 20. For example, the waveguide may be a mesh or a screen formed by a conductive material that enables an airflow through the waveguide and blocks transmission of electromagnetic waves in the external environment 20 through the waveguide.

The first air flow assembly 24 and the second air flow assembly 28 may also include electromagnetic anti-reflective properties. For example, the first air flow assembly 24 and the second air flow assembly 28 may include inner surfaces defined by (or including) electromagnetic absorbing material the same as, or similar to, the electromagnetic absorbing material defining the inner surfaces 22 of the housing 14 described above. Additionally or alternatively, the first air flow assembly 24 and the second air flow assembly 28 may include geometries that reduce or negate reflection of electromagnetic waves back toward the electromagnetically sensitive equipment disposed in the testing chamber 12. For example, as shown in the illustrated embodiment, each of the first air flow assembly 24 and the second air flow assembly 28 may include a bent segment. The bent segment may cause an unabsorbed or under-absorbed electromagnetic wave contacting a first portion of an inner surface of the bent segment to reflect in a preferred direction or at a preferred angle toward and into a second portion of the inner surface, as opposed to being reflected directly back toward the electromagnetically sensitive equipment in the testing chamber 12.

In some instances, the unabsorbed or under-absorbed electromagnetic wave may contact the inner surface of the first air flow assembly 24 or the second air flow assembly 28 multiple (e.g., three, four, or more) times. An intensity of the unabsorbed or under-absorbed electromagnetic wave may be reduced with each instance of the unabsorbed or under-absorbed electromagnetic wave contacting the inner surface. Thus, the bent segment for each of the first air flow assembly 24 and the second air flow assembly 28 may increase a number of instances electromagnetic waves contact the inner surface of the corresponding air flow assembly 24, 28, thereby increasing an attenuation of the electromagnetic waves.

The above-described features, including the electromagnetic barrier, the electromagnetic anti-reflective properties, and the air flow assemblies 24, 28, may improve accuracy and precision of tests conducted for electromagnetically sensitive equipment via the testing apparatus 10. More detailed aspects of the testing apparatus 10 and corresponding air flow assemblies 24, 28 will be provided below with reference to later drawings.

Figure 2:
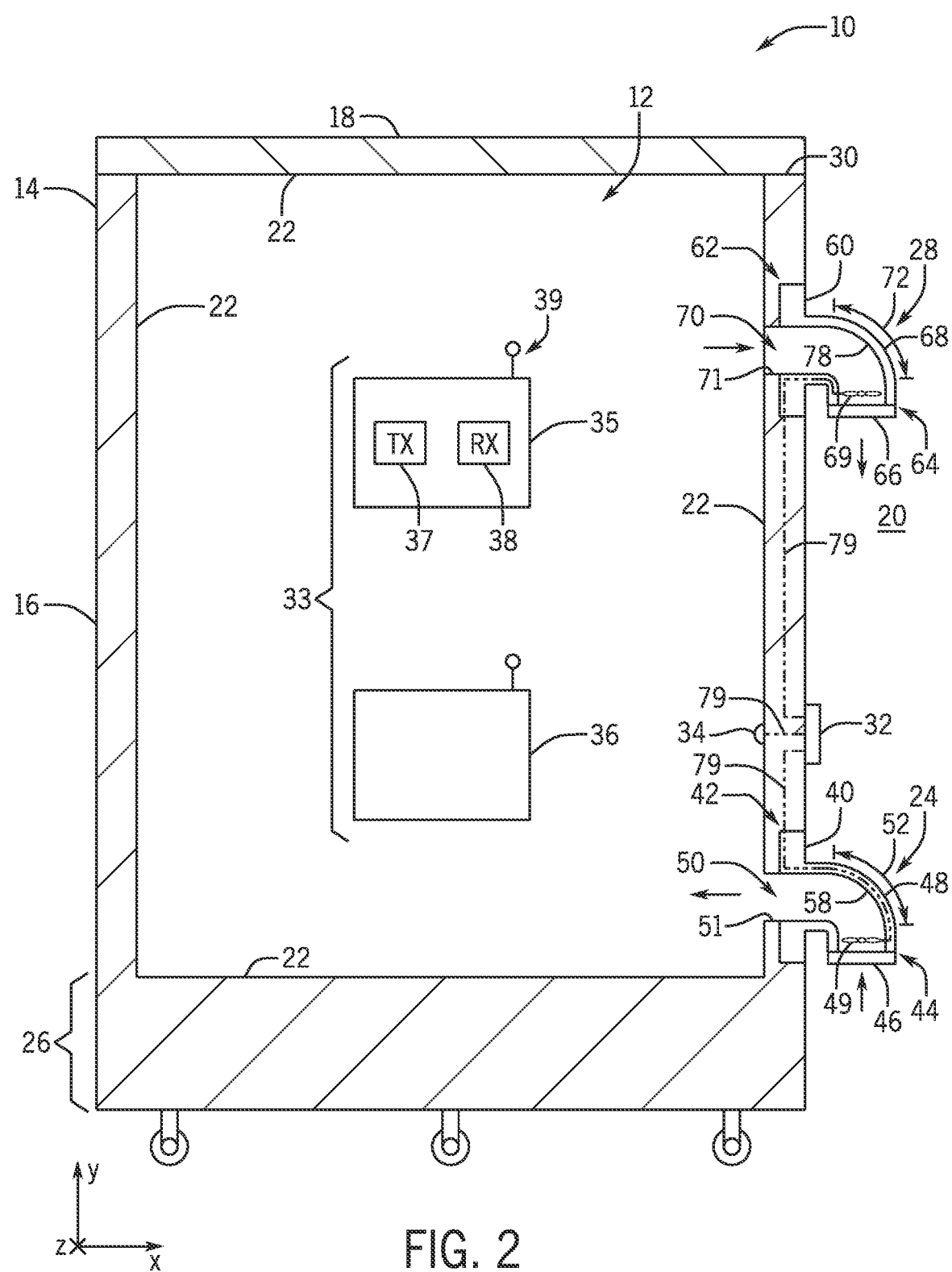
FIG. 2 is a cross-sectional view of the testing apparatus of FIG. 1 with electromagnetically sensitive equipment disposed therein, according to an embodiment of the present disclosure.

FIG. 2 is a cross-sectional view of an embodiment of the testing apparatus 10 of FIG. 1. Electromagnetically sensitive equipment 33 may be disposed in the testing chamber 12 defined by the testing apparatus 10. The electromagnetically sensitive equipment 33 may include a first unit 35 and a second unit 36, where the first unit 35 is tested by the second unit 36. In some embodiments, the second unit 36 may be integrated with the testing apparatus 10 (e.g., integrated with the housing 14 of the testing apparatus 10), as opposed to being separate from the testing apparatus 10 and disposed in the testing chamber 12. In the illustrated embodiment, the first unit 35 being tested includes a transmitter 37 and/or a receiver 38, and one or more antennas 39. The transmitter 37 and the receiver 38 may be collectively referred to as a transceiver. The transmitter 37 of the first unit 35 may emit an electromagnetic signal (e.g., via the one or more antennas 39) and aspects of the electromagnetic signal (e.g., a strength, intensity, quality, and so on, of the electromagnetic signal) may be measured by the second unit 36 and recorded and/or analyzed. Additionally or alternatively, the receiver 38 of the first unit 35 may receive an electromagnetic signal (e.g., via the one or more antennas 39 and from the second unit 36), and aspects of the electromagnetic signal, or derivatives thereof (e.g., aspects of an electrical signal generated from the electromagnetic signal received at the first unit 35), may be recorded and/or analyzed. The above-described examples are provided for context and are not limiting on the types of electromagnetic testing that can be conducted via the disclosed testing apparatus 10.

In the illustrated embodiment, the testing apparatus 10 includes the first air flow assembly 24 disposed adjacent to the base 26 of the testing apparatus 10 and the second air flow assembly 28 disposed adjacent to the top 30 of the body 16 of the housing 14 of the testing apparatus 10. The first air flow assembly 24 includes a mounting plate 40 coupled to the body 16 of the housing 14 of the testing apparatus 10. Thus, the mounting plate 40 defines a proximal end 42 of the first air flow assembly 24. The first air flow assembly 24 also includes a distal end 44 opposing the proximal end 42. A waveguide 46 of the first air flow assembly 24 may be disposed at the distal end 44 of the first air flow assembly 24. The first air flow assembly 24 also includes a tube 48 extending from the proximal end 42 of the first air flow assembly 24 to the distal end 44 of the first air flow assembly 24 (e.g., the waveguide 46 of the first air flow assembly 24). A fan 49 may be disposed within an air flow channel 50 defined by the tube 48. The fan 49 may bias an air flow from the external environment 20 surrounding the testing apparatus 10, through the tube 48, through an opening 51 in the housing 14, and into the testing chamber 12 defined by the housing 14 of the testing apparatus 10.

The mounting plate 40, the tube 48, and the waveguide 46 may include a material, such as a conductive material, that contributes to the electromagnetic barrier around the testing chamber 12 of the testing apparatus 10. Of course, as previously described, the housing 14 of the testing apparatus 10 may also include the same or a similar material (e.g., conductive material) that contributes to the electromagnetic barrier around the testing chamber 12 of the testing apparatus 10. While certain aspects of the testing apparatus 10 may include solid slates of the conductive material, the waveguide 46 of the first air flow assembly 24 may include a mesh or a screen formed by the conductive material. Accordingly, while the waveguide 46 contributes to the electromagnetic barrier formed by the testing apparatus 10 about the testing chamber 12, the waveguide 46 may also enable the above-described air flow from the external environment 20 into the testing chamber 12.

The tube 48 includes an inner surface 58 defining an air flow channel 50 through which the above-described air flow travels. A bent segment 52 of the tube 48 in the illustrated embodiment may cause electromagnetic waves that reach the tube 48 from the electromagnetically sensitive equipment 33 to reflect multiple times from the inner surface 58, as opposed to being reflected directly back toward the electromagnetically sensitive equipment 33. For example, certain electromagnetic waves generated by the electromagnetically sensitive equipment 33 within the testing chamber 12 may propagate toward the air flow channel 50 defined by the inner surface 58 of the tube 48. That is, the bent segment 52 may cause an electromagnetic wave that contacts a first portion of the inner surface 58 to reflect in a preferred direction or at a preferred angle toward a second portion of the inner surface 58. Moreover, each instance of the electromagnetic wave reflecting from the inner surface 58 of the tube 48 may further attenuate an intensity of the electromagnetic wave.

In some embodiments, the inner surface 58 may also be defined by (or include) an electromagnetic absorbing material that attenuates an intensity of the electromagnetic wave. The electromagnetic absorbing material may include, for example, a dielectric material, such as a dielectric polyurethane foam material. An example of a dielectric polyurethane material associated with the inner surface 58 of the tube 48 is Eccosorb® AN-79. As previously described, the inner surfaces 22 of the housing 14 of the testing apparatus 10 may include the same or similar electromagnetic absorbing material.

The second air flow assembly 28 may generally include the same or similar features as the first air flow assembly 24, and may direct an air flow from the testing chamber 12 to the external environment 20. For example, the second air flow assembly 28 may include a mounting plate 60 defining a proximal end 62 of the second air flow assembly 28, a distal end 64 including a waveguide 66 of the second air flow assembly 28, a tube 68 extending from the proximal end 62 to the distal end 64, a fan 69 disposed in the tube 68, an air flow channel 70 defined by an inner surface 78 of the tube 68, and a bent segment 72 of the tube 68. In some embodiments, only one of the fans 49, 69 may be employed. For example, the first air flow assembly 24 may not include the fan 49 in certain embodiments, or the second air flow assembly 28 may not include the fan 69 in certain embodiments.

As previously described, the testing apparatus 10 in the illustrated embodiment includes the thermostat 32 that may control the fan(s) 49, 69. As shown, the thermostat 32 may be electrically coupled to the sensor 34, the fan 49 of the first air flow assembly 24, and the fan 69 of the second air flow assembly 28 via electrical wires 79 (e.g., extending through the housing 14). In some embodiments, the fan(s) 49, 69 may be disposed outside of the electromagnetic barrier formed by the testing apparatus 10, and in such embodiments, the thermostat 32 may control the fan(s) 49, 69 via wireless communication.

By including the above-referenced features, the testing apparatus 10 may shield the electromagnetically sensitive equipment 33 in the testing chamber 12 from undesirable electromagnetic interference while also enabling air flows through the testing chamber 12 and, thus, control a temperature of the testing chamber 12. Detailed aspects of the air flow assemblies 24, 28 are described in below with reference to FIGS. 3-9. It should be understood that FIGS. 3-9 illustrate the second air flow assembly 28, but that the same or similar features may be employed at the first air flow assembly 24.

Figure 3:
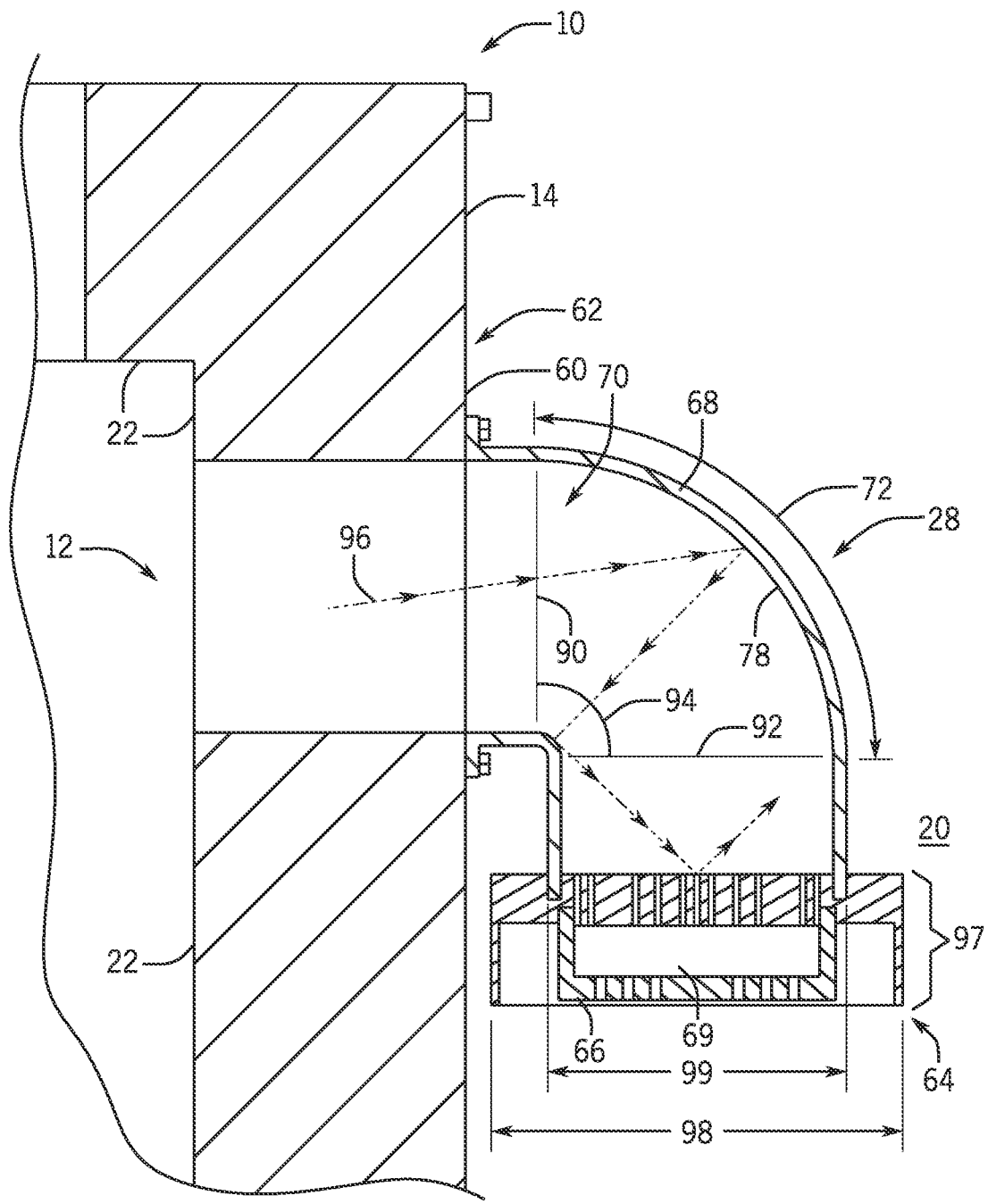
FIG. 3 is a cross-sectional view of an air flow assembly for use in the testing apparatus of FIG. 1, according to an embodiment of the present disclosure.

FIG. 3 is a cross-sectional view of an embodiment of one of the air flow assemblies 28 for use in the testing apparatus 10 of FIG. 1. The air flow assembly 28 in FIG. 3 includes some of the same or similar features described above with respect to FIG. 2. For example, the air flow assembly 28 includes the mounting plate 60 defining the proximal end 62 of the air flow assembly 28, the distal end 64 including (or defined by) the waveguide 66 of the air flow assembly 28, the tube 68 extending from the proximal end 62 to the distal end 64, the fan 69 disposed in the tube 68, the air flow channel 70 defined by the inner surface 78 of the tube 68, and the bent segment 72 of the tube 68.

In the illustrated embodiment, the bent segment 72 of the tube 68 includes a 90 degree bend. For example, the bent segment 72 may begin at a first reference plane 90 and end at a second reference plane 92, where the first reference plane 90 and the second reference plane 92 intersect to form an angle 94. In the illustrated embodiment, the angle 94 is 90 degrees. However, as will be appreciated with reference to later drawings and corresponding description, the angle 94 may be 45-135 degrees, 55-125 degrees, 65-115 degrees, 75-115 degrees, 85-95 degrees, or any other suitable angle that reduces intensity of one or more reflections of the electromagnetic wave 96. As shown, the bent segment 72 may cause an electromagnetic wave 96 that enters the air flow channel 70 from the testing chamber 12 to reflect in a preferred direction or at a preferred angle that causes the electromagnetic wave 96 to contact the inner surface 78 multiple times. With each contact of the electromagnetic wave 96 against the inner surface 78, an intensity of the electromagnetic wave 96 may be reduced. As previously described, the inner surface 78 of the tube 68 (and the inner surfaces 22 of the housing 14) may be defined by (or include) an electromagnetic absorbing material (e.g., a dielectric material, a polyurethane material, etc.) that may further attenuate an intensity of the electromagnetic wave 96 (e.g., by 20-50 decibels).

As shown in the illustrated embodiment, the fan 69 of the air flow assembly 28 may extend into the waveguide 66 of the air flow assembly 28. Alternatively, the fan 69 may be disposed between the waveguide 66 and the testing chamber 12. The waveguide 66 may operate to form a portion of the electromagnetic barrier of the testing apparatus 10 while enabling an air flow through the air flow channel 70 of the air flow assembly 28. For example, the waveguide 66 may include a mesh or a screen formed by a conductive material. Further, as shown, an end unit 97 of the air flow assembly 28 may include a width 98 that is greater than a width 99 of a portion of the tube 68 between the end unit 97 and the bent segment 72 of the tube 68. The width 98 may be sized to accommodate the waveguide 66 and the fan 69.

The air flow assembly 28 illustrated in FIG. 3 includes a single tube configuration including only one tube 68. However, in certain operating conditions and/or with certain types of electromagnetically sensitive equipment being tested, the testing apparatus 10 may benefit from more robust temperature control, and in certain other operating conditions and/or with certain other types of electromagnetically sensitive equipment being tested, the testing apparatus 10 may not include any fan-induced temperature control. Accordingly, the air flow assembly 28 may include various configurations to enable more robust temperature control or no fan-induced temperature control.

Figure 4:
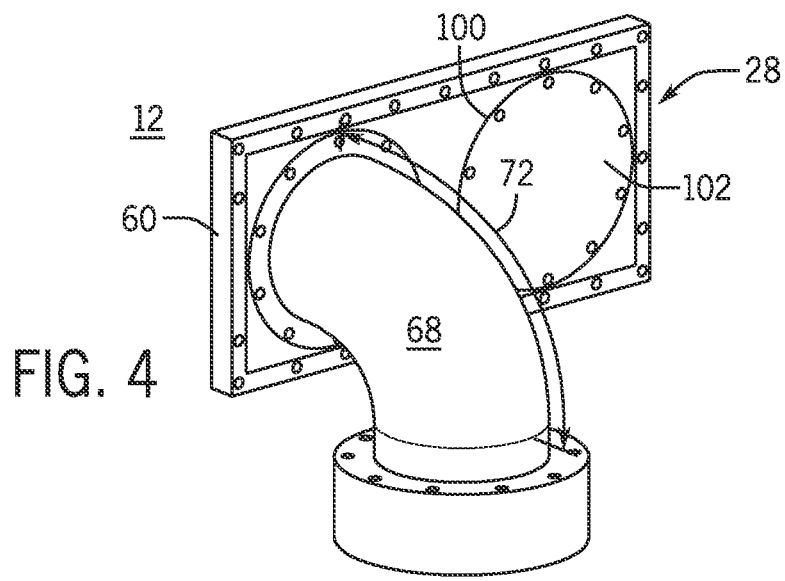
FIG. 4 is a perspective view of a single tube configuration of the air flow assembly of FIG. 3, according to an embodiment of the present disclosure.
Figure 5:
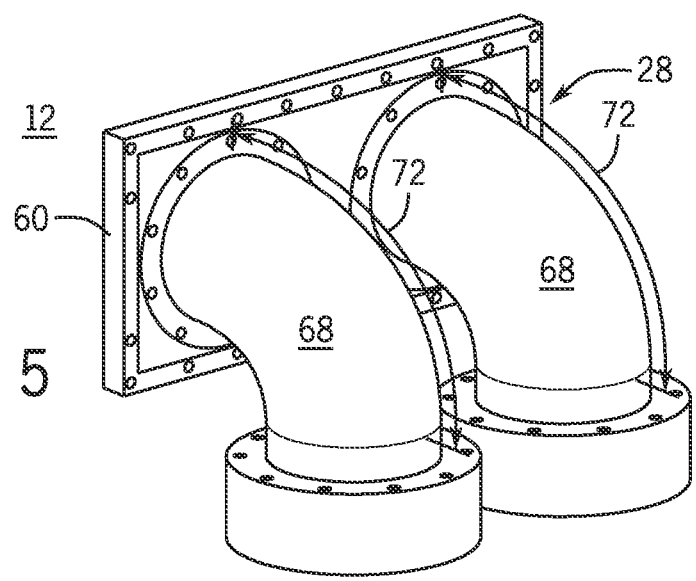
FIG. 5 is a perspective view of a dual tube configuration of the air flow assembly of FIG. 3, according to an embodiment of the present disclosure.

For example, FIG. 4 is a perspective view of an embodiment of a single tube configuration of the air flow assembly 28 of FIG. 3. That is, the air flow assembly 28 in FIG. 4 includes only one instance of the tube 68, and includes an opening 100 in the mounting plate 60 enclosed by a plate 102. Thus, air flow through the opening 100 is blocked by the plate 102. The plate 102 may include an electromagnetic absorbing material facing the testing chamber 12. FIG. 5 is a perspective view of an embodiment of a dual tube configuration of the air flow assembly 28 of FIG. 3, which may provide more robust temperature control. That is, FIG. 5 includes two instances of the tube 68 coupled to the mounting plate 60, where air flows are permitted through both instances of the tube 68. In other words, the plate 102 in FIG. 4 may be removed from the opening 100 and replaced by another instance of the tube 68, as illustrated in FIG. 5, to generate the dual tube configuration in FIG. 5. In certain embodiments, air flows through the two instances of the tube 68 in FIG. 5 may be in a common direction. For example, the air flows through the first instance of the tube 68 and through the second instance of the tube 68 may be directed toward the testing chamber 12. Alternatively, the air flows through the first instance of the tube 68 and the second instance of the tube 68 may be directed away from the testing chamber 12. In certain other embodiments, air flows through the two instances of the tube 68 in FIG. 5 may be in opposing directions. For example, a first air flow through the first instance of the tube 68 may be directed toward the testing chamber 12, while a second air flow through the second instance of the tube 68 may be away from the testing chamber 12.

Figure 6:
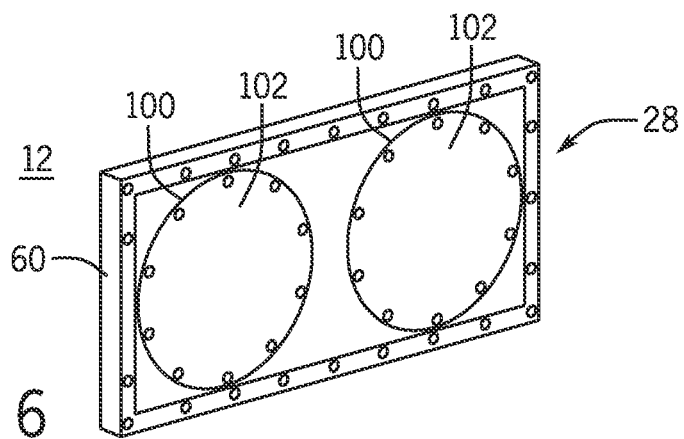
FIG. 6 is a perspective view of a closed configuration of the air flow assembly of FIG. 3, according to an embodiment of the present disclosure.

FIG. 6 is a perspective view of an embodiment of a closed configuration of the air flow assembly 28 of FIG. 3, which may provide no fan-induced temperature control. That is, FIG. 6 includes two instances of the plate 102 enclosing both instances of the opening 100 in the mounting plate 60. Both instances of the plate 102 may include an electromagnetic absorbing material facing the testing chamber 12. As can be seen in FIGS. 4-6, the same mounting plate 60 can be reconfigured to include the single tube configuration (e.g., FIG. 4), the dual tube configuration (e.g., FIG. 5), or the closed configuration (e.g., FIG. 6). Thus, the mounting plate 60 of the air flow assembly 28 may be reconfigured between the various configurations illustrated in FIGS. 4-6 while the mounting plate 60 is coupled to the testing apparatus 10 of FIG. 1.

As previously described, each tube 68 may include the bent segment 72 that increases a number of contacts between certain electromagnetic waves generated within the testing chamber 12 and propagated into the tube 68. In FIGS. 4 and 5, the bent segment 72 includes a 90 degree bend. However, the bent segment 72 in accordance with the present disclosure may include characteristics that differ from the characteristics illustrated in FIGS. 4 and 5. For example, FIGS. 7-9 include schematic side views of various embodiments of the air flow assembly 28 and various characteristics of the bent segment 72 in accordance with the present disclosure.

Figure 7:
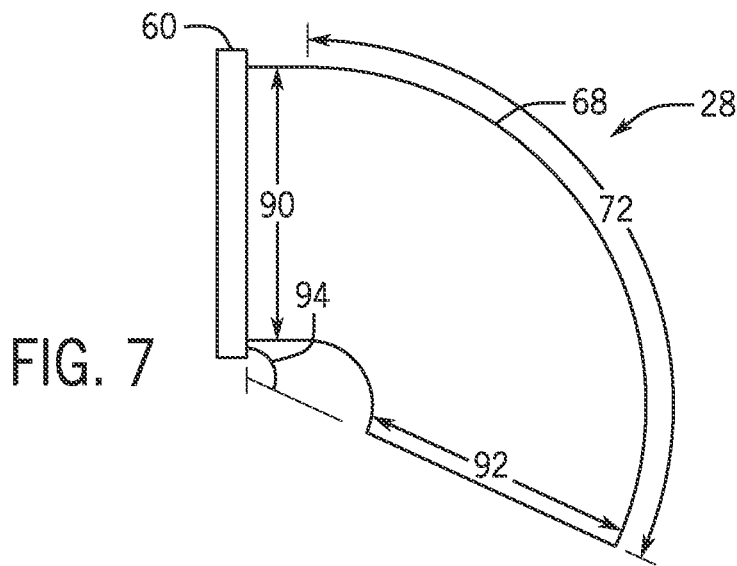
FIG. 7 is a schematic side view of an air flow assembly that bends more than 90 degrees for use in the testing apparatus of FIG. 1, according to an embodiment of the present disclosure.
Figure 8:
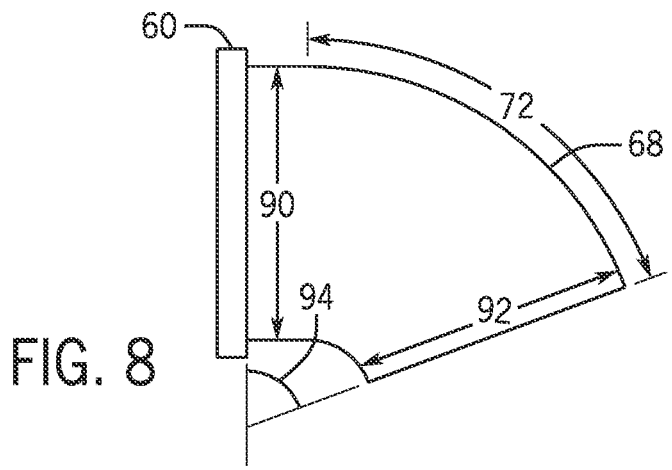
FIG. 8 is a schematic side view of an air flow assembly that bends less than 90 degrees for use in the testing apparatus of FIG. 1, according to an embodiment of the present disclosure.

FIG. 7 illustrates an embodiment of the air flow assembly 28 in which the tube 68 includes the bent segment 72 that bends more than 90 degrees (e.g., more than 110 degrees, more than 130 degrees, and so on, such as 135 degrees). For example, the bent segment 72 begins at the first reference plane 90 and ends at the second reference plane 92, where the first reference plane 90 and the second reference plane 92 intersect to form the angle 94 and the angle 94 is greater than 90 degrees (e.g., more than 110 degrees, more than 130 degrees, and so on, 135 degrees). FIG. 8 illustrates an embodiment of the air flow assembly 28 in which the tube 68 includes the bent segment 72 that bends less than 90 degrees (e.g., less than 70 degrees, less than 50 degrees, and so on, such as 45 degrees). For example, the bent segment 72 begins at the first reference plane 90 and ends at the second reference plane 92, where the first reference plane 90 and the second reference plane 92 intersect to form the angle 94 and the angle 94 is less than 90 degrees (e.g., less than 70 degrees, less than 50 degrees, and so on, such as 45 degrees). In general, the bent segment 72 may include a bend in a range of 45-135 degrees, 55-125 degrees, 65-115 degrees, 75-115 degrees, or 85-95 degrees. Additionally or alternatively, the angle 94 may be 45-135 degrees, 55-125 degrees, 65-115 degrees, 75-115 degrees, or 85-95 degrees.

Figure 9:
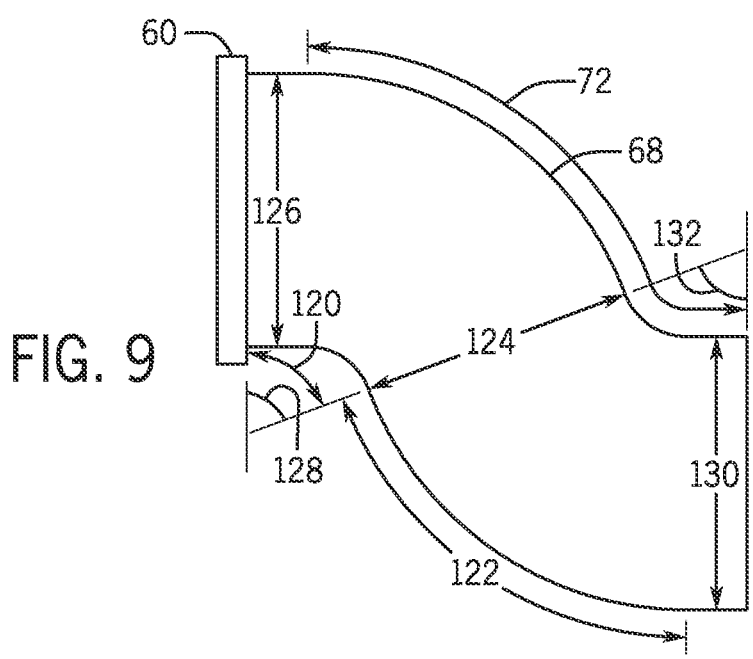
FIG. 9 is a schematic side view of an air flow assembly in which a bent segment of a tube includes a first bent portion, a second bent portion, and an inflection plane between the first and the second bent portions for use in the testing apparatus of FIG. 1, according to an embodiment of the present disclosure.

In some embodiments, the bent segment 72 may include multiple bent portions and one or more inflection planes. For example, FIG. 9 is a schematic side view of an embodiment of the air flow assembly 28 in which the bent segment 72 of the tube 68 includes a first bent portion 120, a second bent portion 122, and an inflection plane 124 between the first bent portion 120 and the second bent portion 122. The first bent portion 120 may extend between a first reference plane 126 and the inflection plane 124, where the first reference plane 126 and the inflection plane 124 intersect to form a first angle 128. The first angle 128 may be 45-135 degrees, 55-125 degrees, 65-115 degrees, 75-115 degrees, or 85-95 degrees. The second bent portion 122 may extend between the inflection plane 124 and a second reference plane 130, where the inflection plane 124 and the second reference plane 130 intersect to form a second angle 132. The second angle 132 may be 45-135 degrees, 55-125 degrees, 65-115 degrees, 75-115 degrees, or 85-95 degrees. While the first angle 128 and the second angle 132 in the illustrated embodiment are equal, in another embodiment, the first angle 128 and the second angle 132 may be different. Further, in certain embodiments, the bent segment 72 of the tube 68 may include more than two bent portions. For example, the bent segment 72 may include three, four, or more bent portions. In general, the embodiments illustrated in FIGS. 7-9 (e.g., including the various types of tubes 68 with various types of bent segments 72) may reduce undesirable effects associated with reflection of electromagnetic waves in testing of electromagnetically sensitive equipment.

Technical effects of the present disclosure include improved temperature control and decreased electromagnetic interference associated with testing apparatuses for electromagnetically sensitive equipment.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or government requirements for maintaining the privacy of users. In particular, personally identifiable information data should be managed and handled so as to minimize risks of unintentional or unauthorized access or use, and the nature of authorized use should be clearly indicated to users.

What is claimed is:

1. A testing apparatus for electromagnetically sensitive equipment, comprising:
   a housing defining a testing chamber, wherein the housing is configured to block transmission of electromagnetic waves from an external environment into the testing chamber and to reduce reflection of electromagnetic waves within the testing chamber; and
   an air flow assembly comprising a tube having an inner surface defining an air flow path between the testing chamber and the external environment, wherein the air flow assembly comprises a conductive material configured to block transmission of electromagnetic waves from the external environment into the air flow path, a proximal end coupled to the housing about an opening in the housing such that the air flow path is fluidly coupled to the testing chamber via the opening, a distal end opposing the proximal end, a bent segment extending between the proximal end and the distal end, and an electromagnetic absorbing material defining a portion of the inner surface of the tube.

2. The testing apparatus of claim 1, wherein the air flow assembly comprising a mounting plate, and the mounting plate comprises:
   a first opening aligned with the tube and disposed at the proximal end of the air flow assembly;
   a second opening; and
   a plate configured to cover the second opening.

3. The testing apparatus of claim 1, comprising a waveguide disposed at the distal end of the air flow assembly, wherein the waveguide is configured to permit an air flow through the air flow path and between the testing chamber and the external environment, and wherein the waveguide is configured to block transmission of electromagnetic waves from the external environment into the air flow path.

4. The testing apparatus of claim 1, comprising a fan disposed in the tube and configured to bias an air flow through the air flow path.

5. The testing apparatus of claim 1, wherein the electromagnetic absorbing material is configured to attenuate an intensity of electromagnetic waves within the air flow path by 20-50 decibels.

6. The testing apparatus of claim 1, wherein the electromagnetic absorbing material comprises a dielectric polyurethane material.

7. The testing apparatus of claim 1, wherein the housing comprises:
   a second conductive material configured to block transmission of electromagnetic waves from the external environment into the testing chamber;
   a second inner surface facing the testing chamber; and
   a second electromagnetic absorbing material defining a second portion of the second inner surface, wherein the second electromagnetic absorbing material is configured to attenuate an intensity of electromagnetic waves within the testing chamber by 20-50 decibels.

8. The testing apparatus of claim 7, wherein the second electromagnetic absorbing material comprises a dielectric polyurethane material.

9. The testing apparatus of claim 1, comprising a second air flow assembly having a second tube defining a second air flow path between the testing chamber and the external environment, wherein the second air flow assembly is configured to block transmission of electromagnetic waves from the external environment into the second air flow path, and wherein the second air flow assembly comprises:
   a second proximal end coupled to the housing about a second opening in the housing such that the second air flow path is fluidly coupled to the testing chamber via the second opening;
   a second distal end opposing the second proximal end; and
   a second bent segment extending between the second proximal end and the second distal end, wherein the air flow assembly is coupled to an upper portion of the housing and configured bias a first air flow from the testing chamber to the external environment, and the second air flow assembly is coupled to a lower portion of the housing and configured to bias a second air flow from the external environment to the testing chamber.

10. The testing apparatus of claim 1, comprising:
a fan configured to bias an air flow through the air flow path; and
a thermostat configured to control the fan based on a temperature in the testing chamber.

11. The testing apparatus of claim 10, comprising a sensor configured to detect the temperature in the testing chamber, wherein the thermostat is configured to:
receive, from the sensor, data indicative of the temperature;
determine, based on the data, whether the temperature exceeds a threshold temperature; and
control a setting of the fan in response to the temperature exceeding the threshold temperature.

12. A testing apparatus for electromagnetically sensitive equipment, comprising:
a housing defining a testing chamber configured to receive the electromagnetically sensitive equipment;
a first air flow assembly comprising a first proximal end coupled to an upper portion of the housing and a first tube extending between the first proximal end and a first distal end of the first air flow assembly, wherein the first tube defines a first air flow channel from the testing chamber to an environment external to the testing apparatus, and wherein the first tube comprises a first bent segment extending between the first proximal end of the first air flow assembly and the first distal end of the first air flow assembly;
a second air flow assembly comprising a second proximal end coupled to a lower portion of the housing and a second tube extending between the second proximal end and a second distal end of the second air flow assembly, wherein the second tube defines a second air flow channel from the environment to the testing chamber, and wherein the second tube comprises a second bent segment extending between the second proximal end of the second air flow assembly and the second distal end of the second air flow assembly; and
an electromagnetic barrier defined about the testing chamber by a first conductive material of the housing, a second conductive material of the first air flow assembly, and a third conductive material of the second air flow assembly.

13. The testing apparatus of claim 12, wherein the first bent segment comprises a 45-135 degree bend between the first proximal end of the first air flow assembly and the first distal end of the first air flow assembly.

14. The testing apparatus of claim 12, wherein the first air flow assembly comprises an inner surface having an electromagnetic absorbing dielectric polyurethane material facing the first air flow channel.

15. The testing apparatus of claim 12, comprising a fan assembly configured to:
bias a first air flow from the testing chamber, through the first air flow channel, and to the environment; and
bias a second air flow from the environment, through the second air flow channel, and to the testing chamber.

16. The testing apparatus of claim 12, comprising a mounting plate of the first air flow assembly, wherein the mounting plate comprises:
a first opening aligned with the first tube and disposed at the first proximal end of the first air flow assembly;
a second opening; and
a plate configured to cover the second opening.

17. An air flow assembly for an electromagnetic testing apparatus, comprising:
mounting plate configured to be coupled to a housing of the electromagnetic testing apparatus and comprising a first conductive material, wherein the mounting plate comprises a first opening, a second opening, and a plate configured to cover the second opening;
a distal end comprising a second conductive material; and
an air flow tube aligned with the first opening, extending to the distal end of the flow assembly, and comprising a third conductive material, wherein the air flow tube defines a 45-135 degree bend between the first opening and the distal end.

18. The air flow assembly of claim 17, comprising a fan configured to bias an air flow through the first opening in the mounting plate, the air flow tube, and the distal end of the air flow assembly.

19. The air flow assembly of claim 17, comprising an electromagnetic absorbing material defining an inner surface of the air flow tube, wherein the electromagnetic absorbing material is configured to attenuate an intensity of electromagnetic waves by 20-50 decibels.

20. The air flow assembly of claim 19, wherein the first conductive material is the same as the second conductive material and the third conductive material.

* * * * *

UNITED STATES PATENT AND TRADEMARK OFFICE
CERTIFICATE OF CORRECTION

| | |
|---|---|
| PATENT NO. | : 11,609,254 B2 |
| APPLICATION NO. | : 17/400054 |
| DATED | : March 21, 2023 |
| INVENTOR(S) | : Jr-Yi Shen et al. |

It is certified that error appears in the above-identified patent and that said Letters Patent is hereby corrected as shown below:

In the Claims

Column 16, Line 22, Claim 17 please insert --a-- before "mounting".

Signed and Sealed this
Thirteenth Day of June, 2023

Katherine Kelly Vidal
*Director of the United States Patent and Trademark Office*